United States Patent
Lee

(10) Patent No.: US 10,956,283 B2
(45) Date of Patent: Mar. 23, 2021

(54) MEMORY SYSTEM CAPABLE OF EFFICIENTLY PERFORMING AN ERROR CORRECTION OPERATION AND OPERATING METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 158 days.

(21) Appl. No.: 16/382,999

(22) Filed: Apr. 12, 2019

(65) Prior Publication Data
US 2020/0089581 A1    Mar. 19, 2020

(30) Foreign Application Priority Data

Sep. 14, 2018 (KR) .......... 10-2018-0110371

(51) Int. Cl.
*G06F 11/14* (2006.01)
*G11C 16/30* (2006.01)
*G11C 16/04* (2006.01)

(52) U.S. Cl.
CPC .......... *G06F 11/1471* (2013.01); *G11C 16/30* (2013.01); *G06F 2201/82* (2013.01); *G06F 2201/84* (2013.01); *G11C 16/0483* (2013.01)

(58) Field of Classification Search
CPC ............. G06F 11/1469; G06F 11/1471; G06F 11/1474; G06F 11/1446; G06F 11/1448; G06F 11/1458
See application file for complete search history.

(56) References Cited

U.S. PATENT DOCUMENTS

2019/0266044 A1*  8/2019  Gupta ................. G06F 11/1474

FOREIGN PATENT DOCUMENTS

| KR | 10-1615907 | 4/2016 |
| KR | 10-2016-0055723 | 5/2016 |
| KR | 10-1639672 | 7/2016 |

* cited by examiner

*Primary Examiner* — Matthew M Kim
*Assistant Examiner* — Kurosu Risa Altaf
(74) *Attorney, Agent, or Firm* — IP & T Group LLP

(57) ABSTRACT

A memory system includes: a memory device suitable for storing system operating information; and a controller suitable for performing a check-pointing operation whenever a background operation is to be performed, performing the background operation based on the system operating information, and performing a roll-back operation based on the system operating information stored by the check-pointing operation at a time right before the background operation is performed when an error occurs during the background operation, wherein the controller performs the roll-back operation by reflecting error information on the error into the system operating information, and performing the background operation based on the system operating information with the error information reflected therein.

20 Claims, 17 Drawing Sheets

MEMORY SYSTEM CAPABLE OF EFFICIENTLY PERFORMING AN ERROR CORRECTION OPERATION AND OPERATING METHOD THEREOF

CROSS-REFERENCE TO RELATED APPLICATION

The present application claims priority of Korean Patent Application No. 10-2018-0110371, filed on Sep. 14, 2018, which is incorporated herein by reference in its entirety.

BACKGROUND

1. Field

Various embodiments of the present invention relate to a memory system, and more particularly, to a memory system capable of efficiently performing an error correction operation, and a method for operating the memory system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts, as compared with a hard disk device. Examples of memory systems having such advantages include universal serial bus (USB) memory devices, memory cards having various interfaces, and solid state drives (SSDs).

SUMMARY

Embodiments of the present invention are directed to a memory system capable of efficiently performing an error correction operation.

In accordance with an embodiment of the present invention, a memory system includes: a memory device suitable for storing system operating information; and a controller suitable for performing a check-pointing operation whenever a background operation is to be performed, performing the background operation based on the system operating information, and performing a roll-back operation based on the system operating information stored by the check-pointing operation at a time right before the background operation is performed when an error occurs during the background operation, wherein the controller performs the roll-back operation by reflecting error information on the error into the system operating information, and performing the background operation based on the system operating information with the error information reflected therein.

In accordance with another embodiment of the present invention, a method for operating a memory system includes: performing a check-pointing operation whenever a background operation is to be performed; performing the background operation based on system operating information; and performing a roll-back operation based on the system operating information stored by the check-pointing operation at a time right before the background operation is performed when an error occurs during the background operation, wherein the performing of the roll-back operation includes reflecting error information on the error into the system operating information obtained by the check-pointing operation, and performing the background operation based on the system operating information with the error information reflected therein.

In accordance with an embodiment of the present invention, a memory system includes: a memory device; and a controller suitable for: performing a check-pointing operation including storing system operating information in the memory device; performing a background operation for the memory device, based on the system operating information, after performing the check-pointing operation; determining whether an error occurred during the background operation; updating the system operating information to reflect information on the error, when it is determined that an error occurred; and performing the background operation based on the updated system operating information.

DETAILED DESCRIPTION

Figure 1:
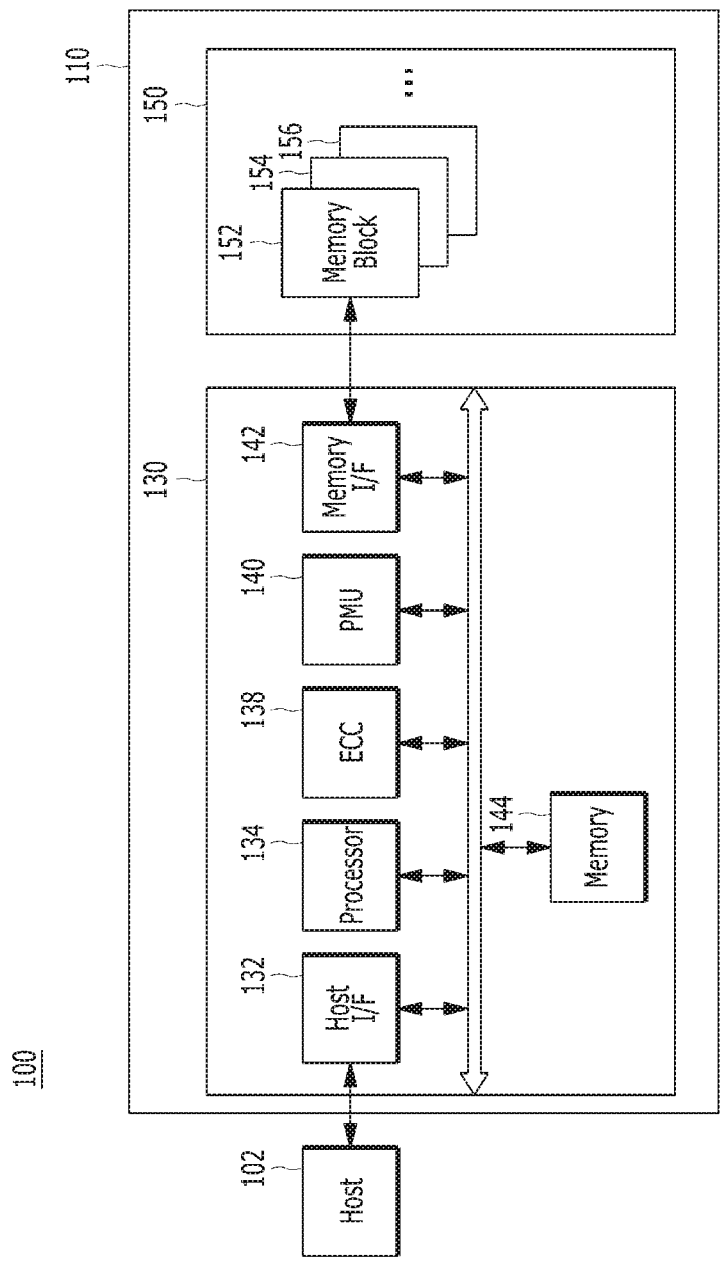
FIG. 1 is a block diagram illustrating a data processing system including a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first" and/or "second" may be used herein to identify various elements, these elements should not be limited by these terms. These terms are only used to distinguish one element from another element that otherwise have the same or similar names. For example, a first element in one instance could be termed a second element in another instance, and vice versa, without departing from the teachings of the present disclosure.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way. Communication between two elements, whether directly or indirectly connected/coupled, may be wired or wireless, unless the context indicates otherwise.

The terminology used herein is for the purpose of describing particular embodiments only and is not intended to be limiting. In the present disclosure, the singular forms are intended to include the plural forms and vice versa, unless the context clearly indicates otherwise. The articles 'a' and 'an' as used in this application and the appended claims should generally be construed to mean 'one or more' unless specified otherwise or clear from context to be directed to a singular form. It will be further understood that the terms "comprise", "include", "have", and other open-ended transition terms, when used in this specification, specify the presence of stated features, numbers, steps, operations, elements, components, and/or combinations of them but do not preclude the presence or addition of one or more other features, numbers, steps, operations, elements, components, and/or combinations thereof.

The embodiments disclosed herein are merely for the purpose of understanding the technical spirit of the present disclosure and the scope of the present invention should not be limited to the disclosed embodiments. Those skilled in the art to which the present disclosure pertains will understand in light of the present disclosure that various modifications may be made within the scope of the present invention.

Unless otherwise defined, all terms including technical and scientific terms used herein have the same meaning as commonly understood by one of ordinary skill in the art to which the present disclosure pertains. Unless otherwise defined in the present disclosure, the terms should not be construed in an ideal or excessively formal way.

Various embodiments of the present invention will be described now in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include any of a variety of portable electronic devices such as a mobile phone, a MP3 player and a laptop computer, or any of a variety of non-portable electronic devices such as a desktop computer, a game machine, a television (TV) and a projector.

The host 102 may include at least one operating system (OS) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of the memory system 110 include a solid state drive (SSD), a multi-media card (MMC) and an embedded MMC (eMMC).

The memory system 110 may include various types of storage devices. Non-limiting examples of such storage devices include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a controller 130 and a memory device 150.

The controller 130 and the memory device 150 may be integrated into a single semiconductor device, which may be included in any of the various types of memory systems as described above. For example, the controller 130 and the memory device 150 may be integrated as a single semiconductor device to constitute an SSD, a personal computer memory card international association (PCMCIA) card, a secure digital (SD) card including a mini-SD, a micro-SD and a SDHC, and a universal flash storage (UFS) device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156, each of which may include a plurality of pages, each of which may include a plurality of memory cells coupled to a word line. In an embodiment, the memory device 150 may be a flash memory having a 3-dimensional (3D) stack structure.

The structure of the memory device 150 and the 3D stack structure of the memory device 150 will be described in detail below with reference to FIGS. 2 to 4.

The controller 130 may control the memory device 150 in response to a request from the host 102. For example, the controller 130 may provide data read from the memory device 150 to the host 102, and store data provided from the host 102 to the memory device 150. For this operation, the controller 130 may control read, write, program and erase operations of the memory device 150.

More specifically, the controller 130 may include a host interface (I/F) 132, a processor 134, an error correction code (ECC) component 138, a power management unit (PMU) 140, a memory interface 142, and a memory 144, all operatively coupled or engaged via an internal bus.

The host interface 132 may process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via firmware, that is, a host interface layer (HIL) for exchanging data with the host 102.

Further, the ECC component 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150. The ECC decoder may detect and correct an error contained in the data read from the memory device 150. The ECC component 138 may perform error correction through a coded modulation such as a Low Density Parity Check (LDPC) code, a Bose-Chaudhri-Hocquenghem (BCH) code, a turbo code, a Reed-Solomon code, a convolution code, a Recursive Systematic Code (RSC), a Trellis-Coded Modulation (TCM) and a Block coded modulation (BCM). However, the ECC component 138 is not limited to these error correction techniques. As such, the ECC component 138 may include any and all circuits, modules, systems or devices for performing suitable error correction.

The PMU 140 may manage electrical power used and provided in the controller 130.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130, and store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows the memory 144 disposed within the controller 130. In an embodiment, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache and a map buffer/cache to store some data required to perform data write and read operations between the host 102 and the memory device 150 and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). The processor 134 may be implemented with a microprocessor or a central processing unit (CPU).

For example, the controller 130 may perform an operation requested by the host 102 in the memory device 150 through the processor 134. Also, the controller 130 may perform a background operation on the memory device 150 through the processor 134. The background operation performed on the memory device 150 may include an operation of copying and processing data stored in some memory blocks among the memory blocks 152 to 156 of the memory device 150 into other memory blocks, e.g., a garbage collection (GC) operation, an operation of swapping data among some of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156 in the memory device 150.

The memory device of the memory system in accordance with an embodiment of the present invention is described in detail with reference to FIGS. 2 to 4.

Figure 2:
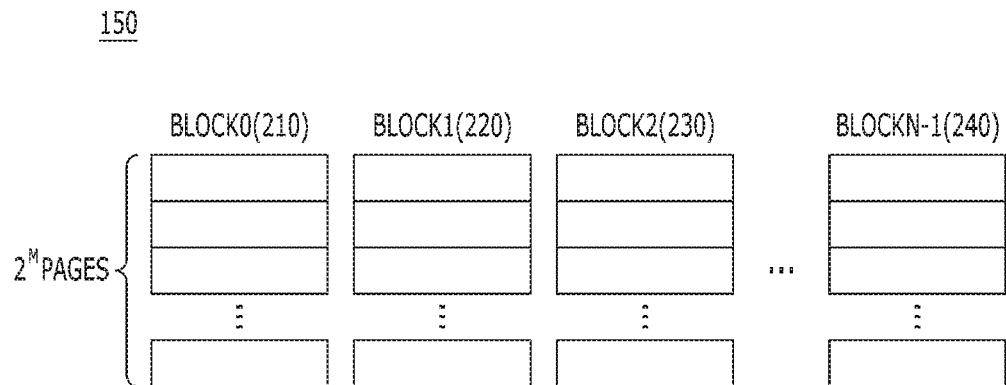
FIG. 2 is a schematic diagram illustrating a configuration of a memory device employed in the memory system shown in FIG. 1.

FIG. 2 is a schematic diagram illustrating the memory device 150. FIG. 3 is a circuit diagram illustrating a configuration of a memory cell array of a memory block 330 in the memory device 150. FIG. 4 is a schematic diagram illustrating a 3-dimensional (3D) structure of the memory device 150.

Referring to FIG. 2, the memory device 150 may include a plurality of memory blocks BLOCK0 210 to BLOCKN−1 240, where N is an integer greater than 1. Each of the blocks BLOCK0 210 to BLOCKN−1 240 may include a plurality of pages, for example, $2^M$ or M pages, the number of which may vary according to circuit design, M being an integer greater than 1. Each of the pages may include a plurality of memory cells that are coupled to a plurality of word lines WL.

Also, memory cells in the respective memory blocks BLOCK0 210 to BLOCKN−1 240 may be one or more of a single level cell (SLC) storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data.

Instead of a nonvolatile memory, the memory device 150 may be implemented by any one of a phase change random access memory (PCRAM), a resistive random access memory (RRAM or ReRAM), a ferroelectrics random access memory (FRAM), and a spin transfer torque magnetic random access memory (STT-RAM or STT-MRAM).

The memory blocks 210, 220, 230, 240 may store the data transferred from the host 102 through a program operation, and may transfer data stored therein to the host 102 through a read operation.

Figure 3:
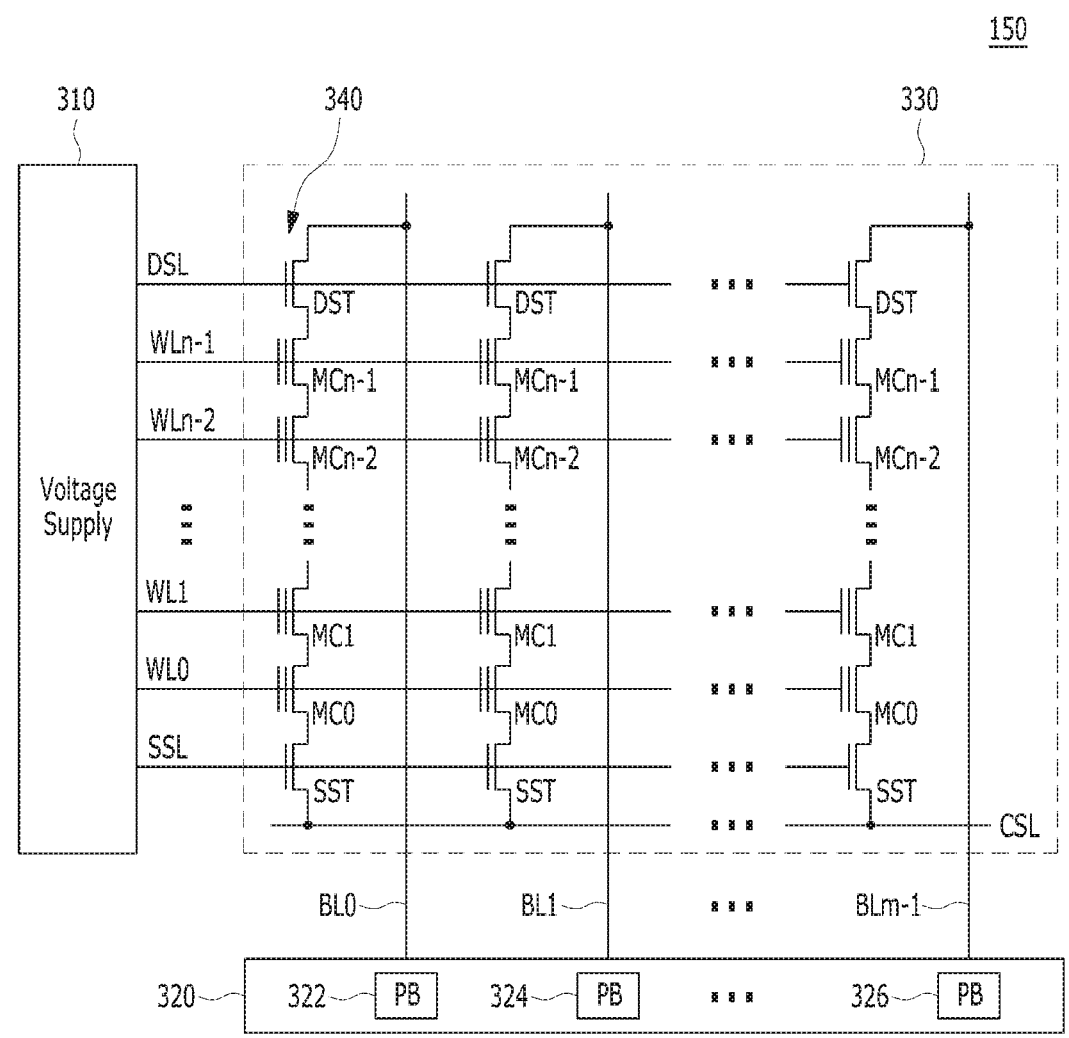
FIG. 3 is a circuit diagram illustrating a configuration of a memory cell array of a memory block in the memory device shown in FIG. 1.
Figure 4:
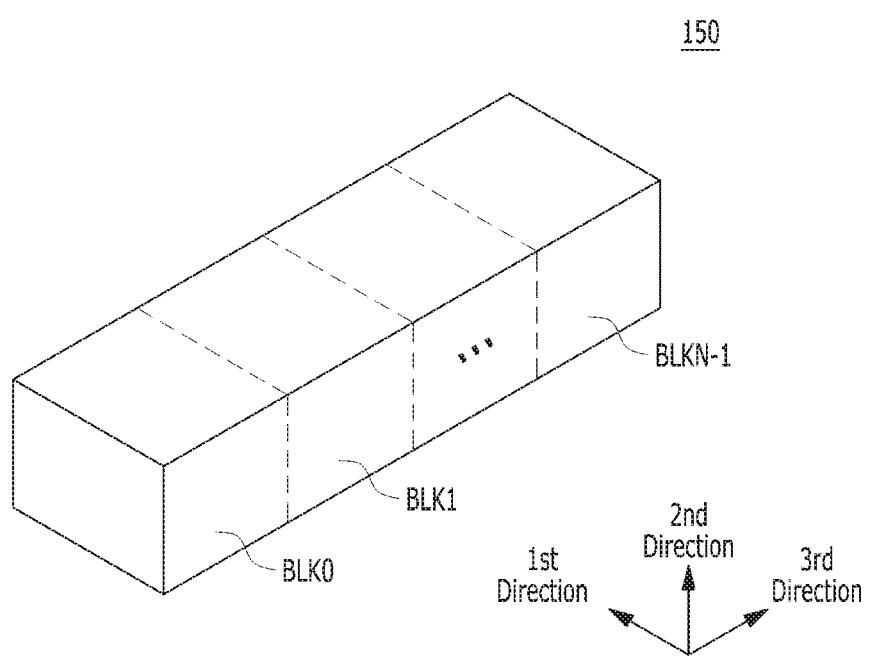
FIG. 4 is a block diagram illustrating a structure of a memory device of a memory system in accordance with an embodiment of the present invention.

Referring to FIG. 3, the memory block 330 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive data to be stored into the memory cell array from a buffer (not illustrated), and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1. FIG. 4 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may be individually and collectively realized by a three-dimensional structure having dimensions extending in three mutually orthogonal directions, e.g., an x-axis direction, a y-axis direction, and a z-axis direction as shown in FIG. 4.

Each memory block 330 included in the memory device 150 may include a plurality of NAND strings NS that are extended in the second direction, and a plurality of NAND strings NS that are extended in the first direction and the third direction. Each of the NAND strings NS (not shown) may be coupled to a bit line BL, at least one source select line SSL, at least one ground select line GSL (not shown), a plurality of word lines WL, at least one dummy word line DWL (not shown), and a common source line CSL, and each of the NAND strings NS may include a plurality of transistor structures TS.

In short, each memory block 330, among the memory blocks 152, 154 and 156 of the memory device 150, may be coupled to a plurality of bit lines BL, a plurality of source select lines SSL, a plurality of ground select lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a source select transistor SST of each NAND string NS may be coupled to a corresponding bit line BL, and a ground select transistor GST of each NAND string NS may be coupled to a common source line CSL. Herein, memory cells MC may be provided between the source select transistor SST and the ground select transistor GST of each NAND string NS. In other words, a plurality of memory cells may be realized in each memory block 330 of the memory device 150.

In the memory system 100 above, a roll-back operation may be performed. The roll-back operation may refer to an operation of returning the current state of data to the existing normal state when the data is not valid or when an error occurs during an update operation. The controller 130 may control the memory device 150 to perform a check-pointing operation whenever a background operation is performed to recover the erroneous data to restore the existing normal data. When an error occurs, the controller 130 may perform a roll-back operation of performing the background operation based on the system operating information according to previous check-pointing operation.

Figure 5:
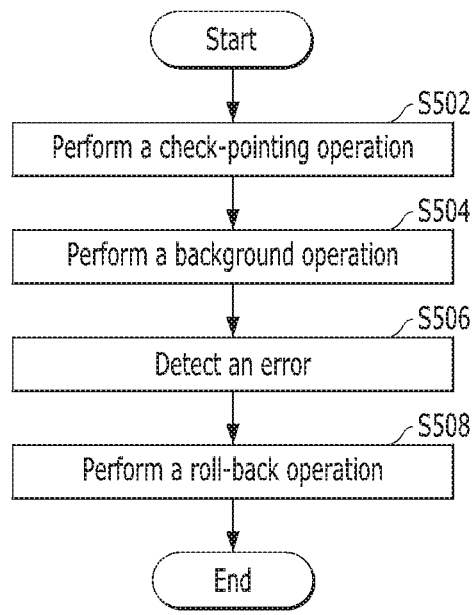
FIG. 5 is a flowchart illustrating a roll-back operation according to prior art.

FIG. 5 is a flowchart illustrating a roll-back operation according to prior art.

Referring to FIG. 5, at step S502, a controller performs a check-pointing operation whenever a background operation is performed to store system operating information right before the background operation. The system operating information is system state information necessary for performing a background operation, such as address information of an open block, erase count information, valid page count information, and read count information.

At step S504, the controller performs a background operation based on the system operating information. The background operation is any of a map update operation, a wear-leveling operation, a data garbage collection operation, a map garbage collection operation, and a read reclaim operation. The controller may perform the background operation based on the system operating information stored in a memory of the controller. For example, the controller 130 detects a source block and a destination block based on the valid page count information and free page count information that are stored in the memory to perform a garbage collection operation.

At step S506, the controller detects an error that occurs, e.g., program failure or VCC voltage drop, while performing the background operation. The controller designates the block in which the error has occurred as a bad block. For example, when the valid data programmed in a destination block is failed data during the execution of a garbage collection operation, the controller designates the destination block in which the program failure occurs as a bad block.

At step S508, when an error occurs at the step S506, the controller performs a roll-back operation of performing a background operation based on the system operating information according to the check-pointing operation performed at the step S502.

However, the controller according to the prior art does not reflect the information about the error (i.e., error information), which is generated at the step S506, into the system operating information stored in the memory blocks by the check-pointing operation performed right before. Therefore, according to the roll-back operation, the current state of data may be able to return to the normal state before the error occurs, but the error information may be lost. Therefore, when the roll-back operation according to the prior art is performed, the damaged data may be recovered and restored to the existing normal data, but the error that may occur after performing the roll-back operation may not be prevented, which is problematic. For example, as the controller performs the roll-back operation, the information on the bad block designated at the step S506 may be lost. Therefore, an error may occur, when the bad block at the step S506 is designated as a destination block after the roll-back operation and then a background operation is performed.

According to an embodiment of the present invention, the controller 130 may perform a roll-back operation by reflecting information about an error occurring during the execution of the background operation into the system operating information stored in the memory blocks by the check-pointing operation performed right before. Therefore, it is possible to prevent an error that may occur after the roll-back operation as well as recovering the error at the same time by performing a roll-back operation while reflecting the error information.

Figure 6:
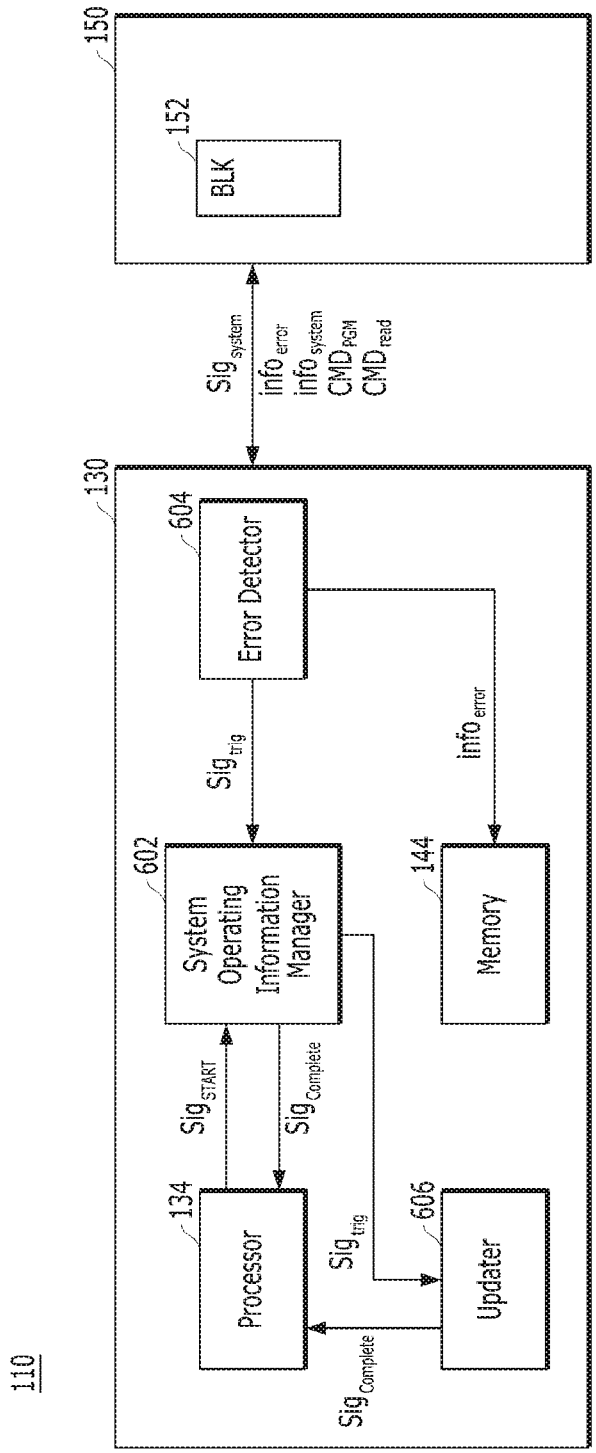
FIG. 6 is a block diagram illustrating a structure of a memory system in accordance with an embodiment of the present invention.

FIG. 6 is a block diagram illustrating a structure of a memory system 110 in accordance with an embodiment of the present invention. For clarity, FIG. 6 shows only the constituent elements pertinent to the description below in the data processing system 100 of FIG. 1. It is to be understood, however, that the memory system 110 of FIG. 6 may include additional components including those shown in FIG. 1 but omitted in FIG. 6.

Referring to FIG. 6, as described above, the memory system 110 may include a memory device 150 and a controller 130. The controller 130 may control the background operation and roll-back operation of the memory device 150.

The controller 130 may include a processor 134 and a memory 144. The controller 130 may further include a system operating information manager 602, an error detector 604, and an updater 606.

The processor 134 may provide the system operating information manager 602 with a start signal $Sig_{start}$ whenever a background operation is performed. According to an embodiment of the present invention, the background operation may include a garbage collection operation, a map update operation, a read reclaim operation, and a wear leveling operation.

The system operating information manager 602 may provide the memory device 150 with a program command $CMD_{PGM}$ and the system operating information $info_{system}$ stored in the memory 144 based on the provided start signal $Sig_{start}$. The memory device 150 may program the system operating information $info_{system}$ into a memory block 152 based on the provided program command $CMD_{PGM}$. The processor 134 may provide the system operating information manager 602 with the start signal $Sig_{start}$ whenever a background operation is performed. The system operating information manager 602 may provide the memory device 150 with the system operating information $info_{system}$ so as to perform a check-pointing operation of storing the system operating information $info_{system}$, representing the system state information at the time right before performance of background operation, into the memory device 150. The system operating information manager 602 may provide the processor 134 with a complete signal $Sig_{complete}$ when a program operation of the memory device 150 is completed.

The processor 134 may control the background operation of the memory device 150 based on the provided complete signal $Sig_{complete}$. The processor 134 may control the memory device 150 to perform a background operation based on the system operating information $info_{system}$ stored in the memory 144. For example, the processor 134 may detect a memory block whose read count is greater than or equal to a threshold value as a victim block and detect a free block as a target block based on read count information and free block information that are stored in the memory 144. Further, the processor 134 may control the memory device 150 to perform a read reclaim operation of copying the valid data stored in the victim block into the target block.

The error detector 604 may detect an error occurring during the execution of the background operation and store the error information $info_{error}$ in the memory 144. The error detector 604 may control the memory device 150 to perform a backup operation of storing the error information $info_{error}$ in the memory blocks when a sudden power-off occurs. According to an embodiment of the present invention, when a program failure occurs during the background operation, the error detector 604 may designate a memory block in which the program failure occurs as a bad block, and store address information of the bad block in the memory 144. For example, when the processor 134 performs a garbage collection operation of copying the valid data stored in a source block into a destination block and it turns out that the valid data programmed in the destination block is a failure data, the error detector 604 may detect the program failure and designate the destination block as a bad block. The error detector 604 may store the address information of the bad block in the memory 144.

According to another embodiment of the present invention, when a VCC voltage drop occurs during a background operation, the error detector 604 may store the address information of a word line which is in the middle of performing a program operation during the VCC voltage drop in the memory 144. When the operation of storing the error information $info_{error}$ in the memory 144 is completed, the error detector 604 may provide the system operating information manager 602 with a trigger signal $Sig_{trig}$.

The system operating information manager 602 may provide the memory device 150 with a read command $CMD_{read}$ based on the provided trigger signal $Sig_{trig}$. The memory device 150 may read the system operating information $info_{system}$ stored in the memory block 152 based on the provided read command $CMD_{read}$. The system operating information manager 602 may provide the updater 606 with the trigger signal $Sig_{trig}$ after storing the read system operating information $info_{system}$ in the memory 144. The system operating information $info_{system}$ may be the system operating information $info_{system}$ stored in the memory 144 right before the processor 134 performs the background operation. The system operating information manager 602 may control the memory device 150 to read the system operating information $info_{system}$ from the memory blocks so as to recover the damaged data, which is produced due to the occurrence of the error, into the existing normal data.

The updater 606 may perform an update operation of reflecting the error information $info_{error}$ into the system operating information $info_{system}$ provided from the memory device 150 based on the provided trigger signal $Sig_{trig}$. According to an embodiment of the present invention, the updater 606 may perform an update operation of reflecting the error information $info_{error}$ into the system operating information $info_{system}$ right before the performance of background operation through synchronization. The updater 606 may store the updated system operating information $info_{system}$ which is produced as a result of the update operation in the memory 144, and then provide the processor 134 with the complete signal n $Sig_{complete}$.

The processor 134 may control the memory device 150 to perform a roll-back operation of performing a background operation based on the updated system operating information $info_{system}$ according to the provided complete signal $Sig_{complete}$. According to an embodiment of the present invention, the processor 134 may prevent an error from occurring after the roll-back operation while recovering the damaged data into the existing normal data by performing a roll-back operation of performing a background operation based on the updated system operating information $info_{system}$ which reflects the error information.

Figure 7:
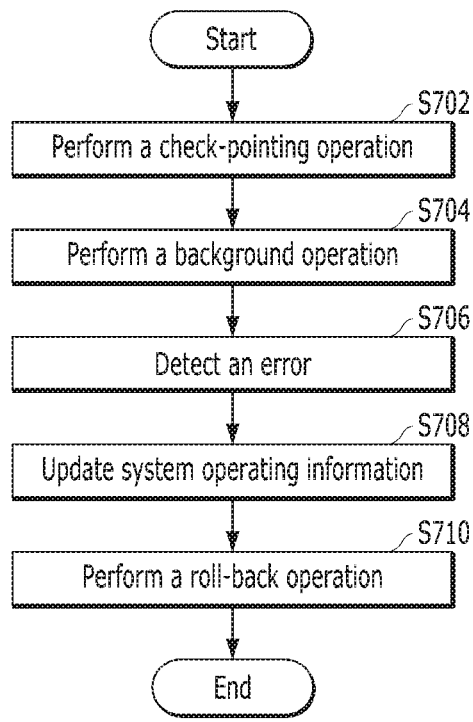
FIG. 7 is a flowchart illustrating an operation of a memory system in accordance with an embodiment of the present invention.

FIG. 7 is a flowchart illustrating an operation of a memory system, e.g., the memory system 110, in accordance with an embodiment of the present invention.

Referring to FIG. 7, the method for operating the memory system 110 may include performing a check-pointing operation at step S702, performing a background operation at step S704, detecting an error at step S706, updating system operating information at step S708, and performing a roll-back operation at step S710.

At step S702, the controller 130 may control the memory device 150 to perform a check-pointing operation whenever a background operation is performed. The system operating information manager 602 may control the memory device 150 to perform a check-pointing operation of storing the system operating information $info_{system}$ in the memory blocks right before the background operation is performed. The processor 134 may provide the system operating information manager 602 with a start signal $Sig_{start}$ whenever a background operation is performed. The system operating information manager 602 may provide the memory device 150 with the system operating information $info_{system}$ stored in the memory 144 along with a program command $CMD_{PGM}$ based on the start signal $Sig_{start}$. The memory device 150 may perform a check-pointing operation of programming the system operating information $info_{system}$ into the memory block 152 based on the program command $CMD_{PGM}$. When the check-pointing operation is completed, the system operating information manager 602 may provide the processor 134 with a complete signal $Sig_{complete}$.

At step S704, the controller 130 may control the memory device 150 to perform a background operation after performing the check-pointing operation. The processor 134 may control the memory device 150 to perform a background operation based on the system operating information $info_{system}$ stored in the memory 144 according to the provided complete signal $Sig_{complete}$.

At step S706, the controller 130 may detect an error occurring while the background operation is performed. The error detector 604 may store information about the error that occurs in the memory 144, and provide the system operating information manager 602 with the trigger signal $Sig_{trig}$. According to an embodiment of the present invention, when a garbage collection operation is performed and it turns out that the valid data programmed in a destination block is failed data, the error detector 604 may designate the destination block as a bad block and then store the address information of the bad block in the memory 144.

Figure 8:
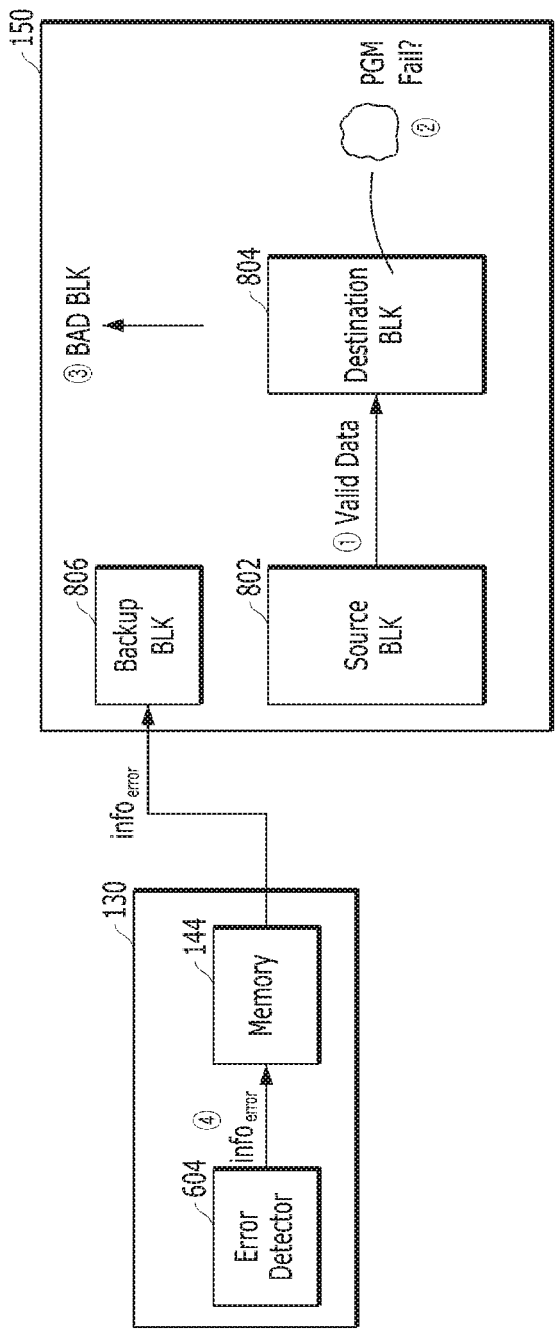
FIG. 8 is a block diagram illustrating an error detection operation in accordance with an embodiment of the present invention.

FIG. 8 is a block diagram illustrating an error detection operation in accordance with an embodiment of the present invention.

When the memory device 150 performs a garbage collection operation of copying the valid data of the source block 802 into a destination block 804 and the valid data programmed in the destination block 804 turns out to be failed data, the error detector 604 may designate the destination block 804 as a bad block. The error detector 604 may store the address information $info_{error}$ of the bad block in the memory 144 based on the map data stored in a map block. The error detector 604 may control the memory device 150 to program the error information $info_{error}$ stored in the memory 144 into a backup block 806 in case a sudden power-off occurs.

Referring back to FIG. 7, at step S708, the controller 130 may perform a system operating information update operation of reflecting the error information $info_{error}$ into the system operating information $info_{system}$ right before a background operation is performed. The system operating information manager 602 may provide the memory device 150 with a read command $CMD_{read}$ based on the provided trigger signal $Sig_{trig}$ so as to read the system operating information $info_{system}$ at a time right before the background operation is performed, which is stored in the memory device 150, and store the read system operating information $info_{system}$ in the memory 144. For example, the system operating information manager 602 may control the memory device 150 to search the most recent system operation information stored in the memory block. The system operation information manager 602 may update the system operating information $info_{system}$ by reflecting the error information $info_{error}$ into the system operation information $info_{system}$.

The system operating information manager 602 may store the system operating information $info_{system}$ in the memory 144 and then provide the updating unit 606 with a trigger signal $Sig_{trig}$. The updater 606 may update the system operating information $info_{system}$ to reflect the error information $info_{error}$ based on the provided trigger signal $Sig_{trig}$. According to an embodiment of the present invention, the updater 606 may perform the update operation by synchronizing the error information info$_{error}$ stored in the memory 144 with the system operating information info$_{system}$ at a time right before the background operation is performed. When the update operation is completed, the updater 606 may provide the processor 134 with a complete signal Sig$_{complete}$.

At step S710, the controller 130 may control the memory device 150 to perform a roll-back operation of performing a background operation based on the updated system operating information info$_{system}$, which is obtained in the step S708. According to an embodiment of the present invention, the processor 134 may prevent an error that may occur after the execution of the roll-back operation as well as recovering the damaged data into the existing normal data at the same time by performing a background operation based on the system operating information info$_{system}$ reflecting the error information info$_{error}$. For example, an error may occur when a bad block is designated as a destination block. However, the processor 134 may be able to prevent the occurrence of such error after the roll-back operation is performed by removing a memory block designated as a bad block, which is detected at the step S706, from a list of candidate blocks for the destination block based on the error information info$_{error}$ and then perform a garbage collection operation.

Figure 9:
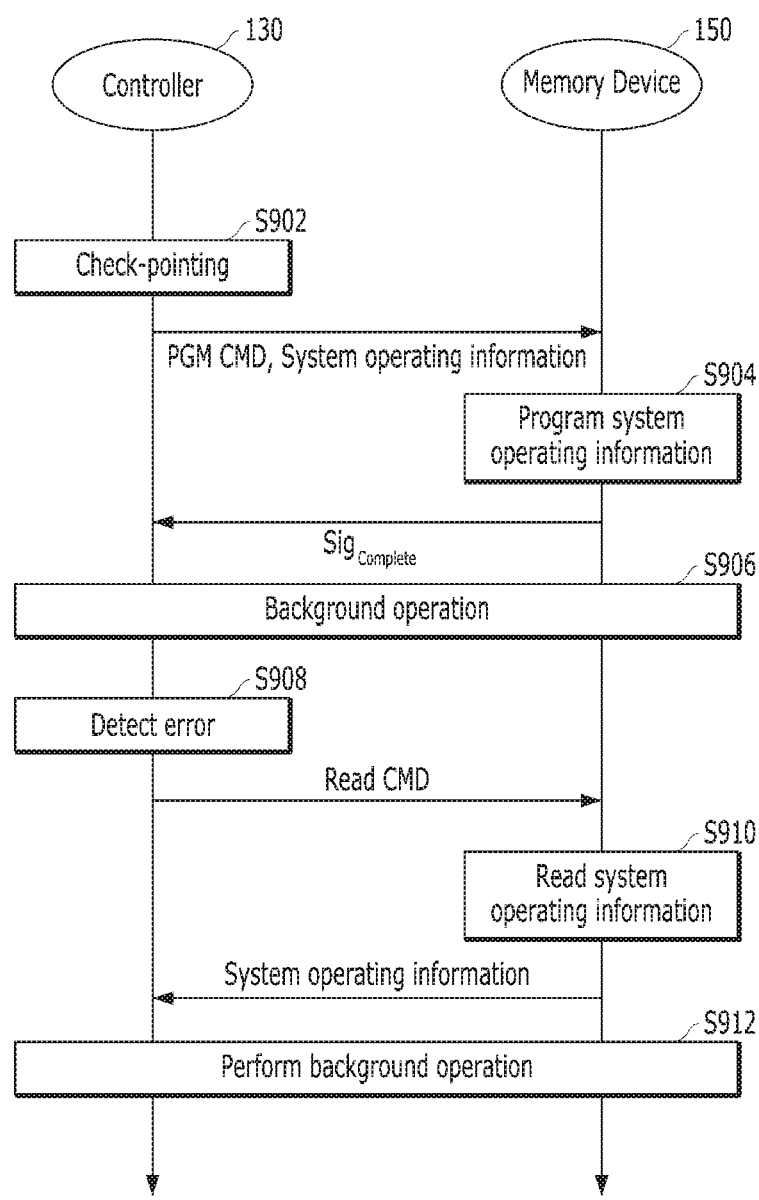
FIG. 9 is a flowchart illustrating an operation of a memory system in accordance with an embodiment of the present invention.

FIG. 9 is a flowchart illustrating an operation of a memory system, e.g., the memory system 110, in accordance with an embodiment of the present invention.

Referring to FIG. 9, at step S902, the controller 130 may provide the memory device 150 with the system operating information info$_{system}$ right before a background operation is performed and a program command CMD$_{PGM}$ for the system operating information info$_{system}$. The controller 130 may control a check-pointing operation of the memory device 150 by providing the memory device 150 with the system operating information info$_{system}$ and the program command CMD$_{PGM}$ whenever a background operation is performed.

At step S904, the memory device 150 may perform a check-pointing operation of programming the system operating information info$_{system}$ into a memory block based on the provided program command CMD$_{PGM}$ under the control of the controller 130. The memory device 150 may provide the controller 130 with a complete signal Sig$_{complete}$ when the check-pointing operation is completed.

At step S906, the controller 130 may control the background operation of the memory device 150. The memory device 150 may perform the background operation based on the provided system operating information info$_{system}$.

At step S908, the controller 130 may detect an error that occurs while performing the background operation. The controller 130 may store information info$_{error}$ on the detected error, which is simply referred to as error information info$_{error}$, in the memory 144 and may control the memory device 150 to perform a background operation of programming the error information into a backup block in preparation for sudden power-off. After detecting the error, the controller 130 may provide the memory device 150 with a read command (i.e., Read COM) for the system operating information info$_{system}$ according to the check-pointing operation.

At step S910, the memory device 150 may read the system operating information info$_{system}$ according to the check-pointing operation in response to the read command. The memory device 150 may provide the controller 130 with the read system operating information info$_{system}$.

At step S912, the controller 130 may update the system operating information info$_{system}$ by reflecting the error information info$_{error}$ detected at the step S908 into the system operating information info$_{system}$ that is read at the step S910. The controller 130 may control the memory device 150 to perform a roll-back operation of performing a background operation based on the updated system operating information info$_{system}$.

A data processing system and electronic devices to which the memory system 110 including the memory device 150 and the controller 130 described above may be applied are described in detail below with reference to FIGS. 10 to 18.

Figure 10:
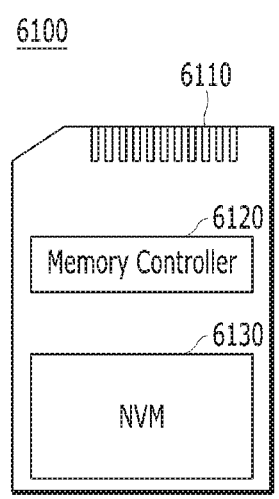
FIGS. 10 to 18 are diagrams schematically illustrating applications of a data processing system in accordance with various embodiments of the present invention.

FIG. 10 is a diagram schematically illustrating another example of the data processing system including the memory system in accordance with an embodiment. FIG. 10 schematically illustrates a memory card system to which the memory system may be applied.

Referring to FIG. 10, the memory card system 6100 may include a memory controller 6120, a memory device 6130 and a connector 6110.

More specifically, the memory controller 6120 may be electrically connected to, and configured to access, the memory device 6130 embodied by a nonvolatile memory. For example, the memory controller 6120 may be configured to control read, write, erase and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface and an error correction component.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system may be applied to wired/wireless electronic devices, including mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state driver (SSD). Also, the memory controller 6120 and the memory device 6130 may be so integrated to form a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and/or a universal flash storage (UFS).

Figure 11:
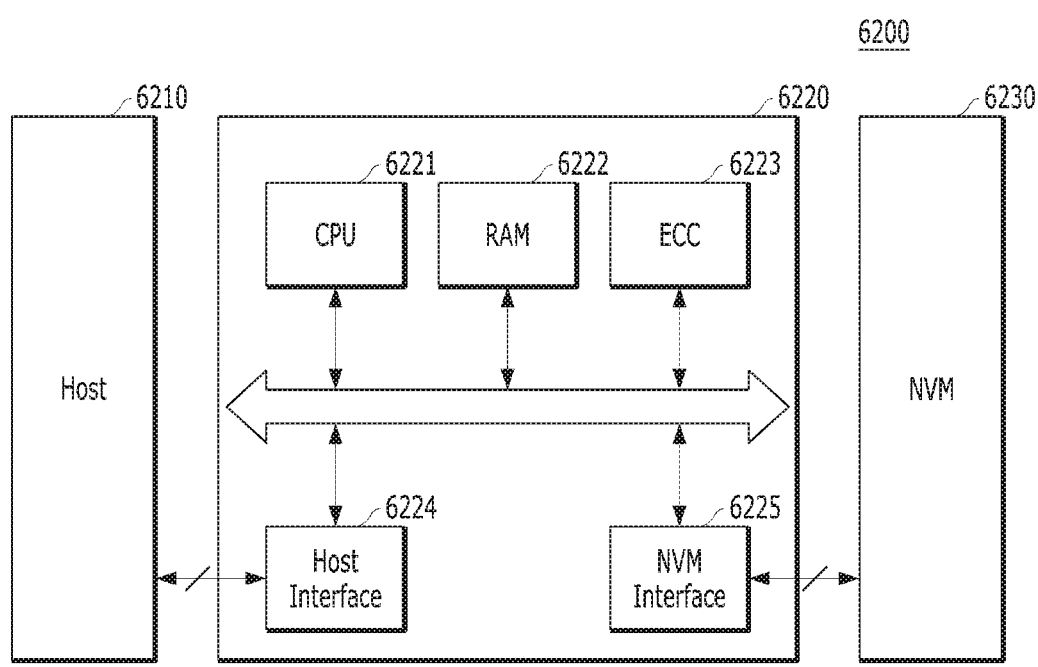

FIG. 11 is a diagram schematically illustrating another example of the data processing system including the memory system in accordance with an embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, a SATA bus, a SCSI, an USB, a PCIe or a NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then exchange data with the external device. In particular, as the memory controller 6220 is configured to communicate with the external device according to one or more of various communication protocols, the memory system and the data processing system may be applied to wired/wireless electronic devices, particularly a mobile electronic device.

Figure 12:
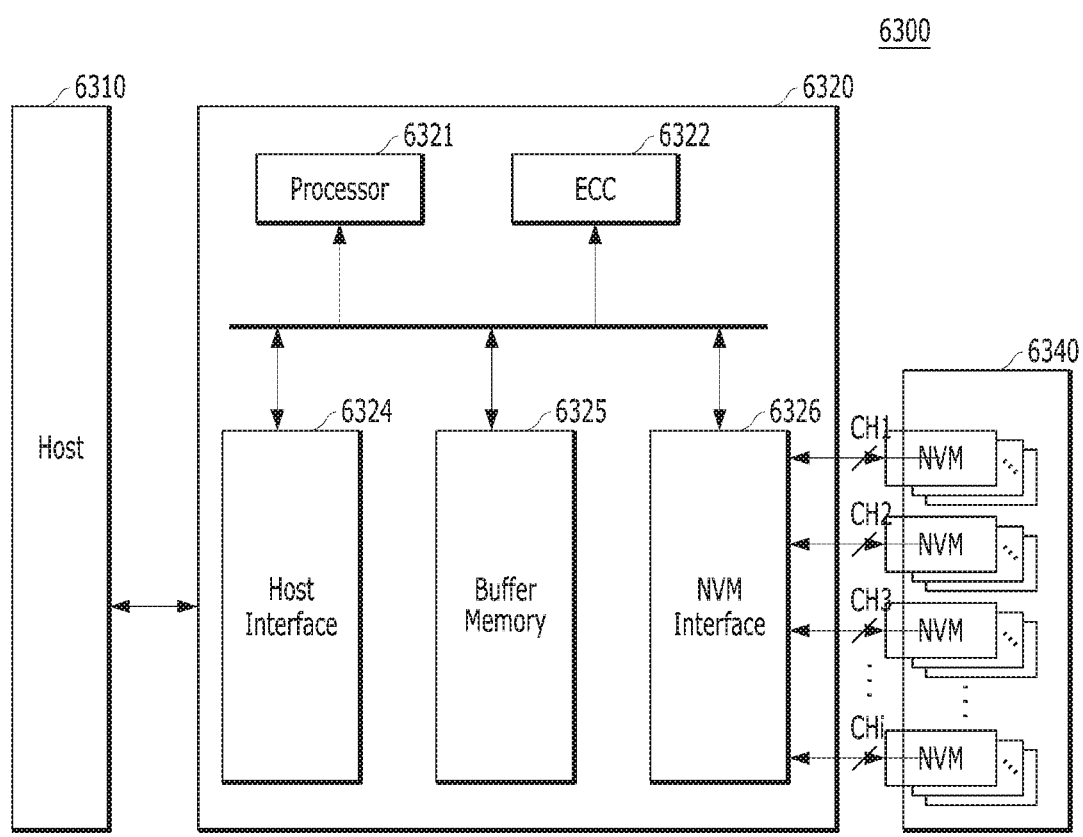

FIG. 12 is a diagram schematically illustrating another example of the data processing system including the memory system in accordance with an embodiment. FIG. 12 schematically illustrates an solid state drive (SSD) 6300 to which the memory system may be applied.

Referring to FIG. 12, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an error correction code (ECC) circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM), FIG. 12 illustrates that the buffer memory 6325 is embodied in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 may be applied may be provided to embody a data processing system, for example, a RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
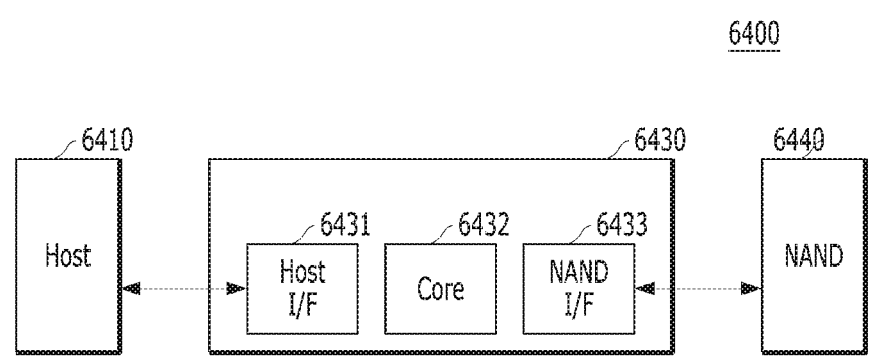

FIG. 13 is a diagram schematically illustrating another example of the data processing system including the memory system in accordance with an embodiment. FIG. 13 schematically illustrates an embedded Multi-Media Card (eMMC) 6400 to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with embodiments. FIGS. 14 to 17 schematically illustrate universal flash storage (UFS) systems to which the memory system may be applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13, and the UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, for example, an UFDs, a MMC, a SD, a mini-SD, and a micro-SD.

Figure 14:
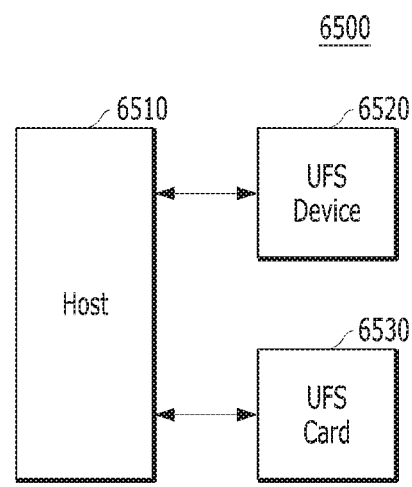

In the UFS system 6500 illustrated in FIG. 14, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 15:
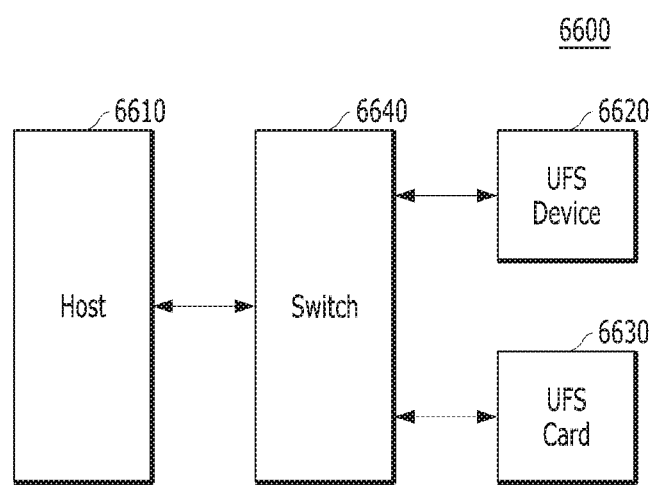

In the UFS system 6600 illustrated in FIG. 15, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 16:
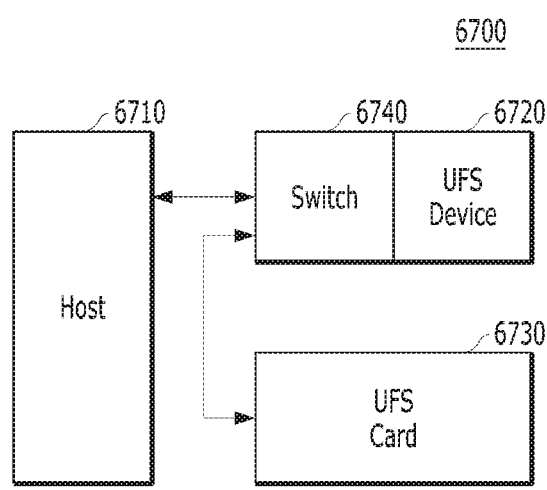

In the UFS system 6700 illustrated in FIG. 16, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 17:
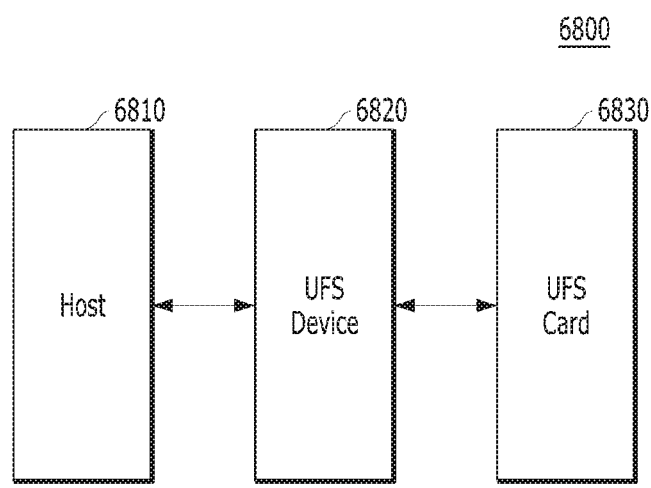

In the UFS system 6800 illustrated in FIG. 17, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 18:
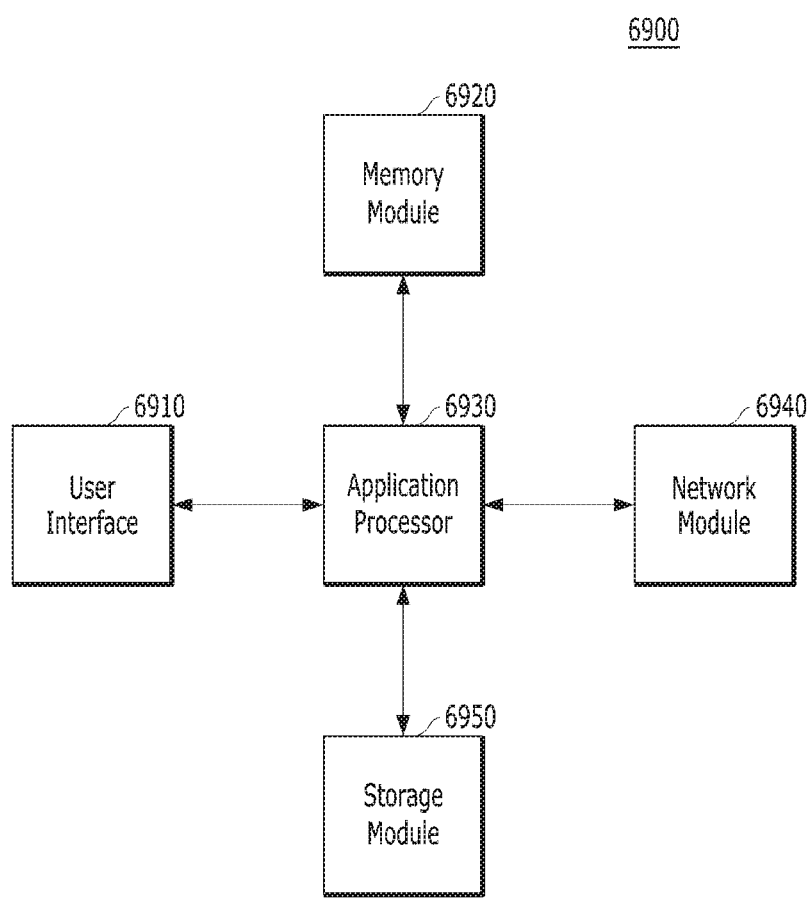

FIG. 18 is a diagram schematically illustrating another example of the data processing system including the memory system in accordance with an embodiment of the present invention. FIG. 18 is a diagram schematically illustrating a user system 6900 to which the memory system may be applied.

Referring to FIG. 18, the user system 6900 may include an application processor 6930, a memory module 6920, a network module 6940, a storage module 6950 and a user interface 6910.

More specifically, the application processor 6930 may drive components in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, a DDR2 SDRAM, a DDR3 SDRAM, a low power DDR (LPDDR) SDARM, a LPDDR2 SDRAM or a LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package-on-Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to various embodiments of the present invention, the memory system may efficiently perform an error correction operation by reflecting error information into system operating information based on a check-pointing operation before a background operation and performing a correct roll-back operation.

While the present disclosure has been illustrated and described with respect to the specific embodiments, it will be apparent to those skilled in the art in light of the present disclosure that various changes and modifications may be made without departing from the spirit and scope of the disclosure as defined in the following claims.

What is claimed is:

1. A memory system, comprising:
   a memory device suitable for storing system operating information; and
   a controller suitable for performing a check-pointing operation whenever a background operation is to be performed, performing the background operation based on the system operating information, and performing a roll-back operation based on the system operating information stored by the check-pointing operation at a time right before the background operation is performed when an error occurs during the background operation,
   wherein the controller performs the roll-back operation by reflecting error information on the error into the system operating information, and performing the background operation based on the system operating information with the error information reflected therein.

2. The memory system of claim 1, further comprising:
a memory suitable for storing the error information and the system operating information.

3. The memory system of claim 1, wherein the check-pointing operation includes storing the system operating information in the memory device at the time right before the background operation is performed.

4. The memory system of claim 2, wherein the controller stores the error information in the memory whenever an error occurs while the background operation is performed.

5. The memory system of claim 3, wherein the controller performs the background operation based on the system operating information at the time right before the background operation is performed by loading the system operating information stored in the memory device into the memory.

6. The memory system of claim 5, wherein the controller performs the roll-back operation by synchronizing the error information stored in the memory with the system operating information that is loaded in the memory.

7. The memory system of claim 1, wherein the error includes a program failure.

8. The memory system of claim 1, wherein the error includes a VCC voltage drop.

9. The memory system of claim 7, wherein the error information includes an address of a memory block where the program failure occurs.

10. The memory system of claim 8, wherein the error information includes an address of a word line where a program operation is performed while the VCC voltage drop occurs.

11. A method for operating a memory system, comprising:
performing a check-pointing operation whenever a background operation is to be performed;
performing the background operation based on system operating information; and
performing a roll-back operation based on the system operating information stored by the check-pointing operation at a time right before the background operation is performed when an error occurs during the background operation,
wherein the performing of the roll-back operation includes
reflecting error information on the error into the system operating information obtained by the check-pointing operation, and performing the background operation based on the system operating information with the error information reflected therein.

12. The method of claim 11, further comprising:
storing the error information and the system operating information in a memory.

13. The method of claim 11, wherein the check-pointing operation includes storing the system operating information in a memory device at the time right before the background operation is performed.

14. The method of claim 12, wherein the performing of the roll-back operation further comprises
storing the error information in the memory whenever an error occurs while the background operation is performed.

15. The method of claim 13, wherein the performing of the roll-back operation includes
performing the background operation based on the system operating information at the time before the background operation is performed by loading the system operating information stored in the memory device into the memory.

16. The method of claim 15, wherein the performing of the roll-back operation is performed by
synchronizing the error information stored in the memory with the system operating information that is loaded in the memory.

17. The method of claim 11, wherein the error includes a program failure.

18. The method of claim 11, wherein the error includes a VCC voltage drop.

19. The method of claim 17, wherein the error information includes an address of a memory block where the program failure occurs.

20. The method of claim 18, wherein the error information includes an address of a word line where a program operation is performed while the VCC voltage drop occurs.

* * * * *